(12) United States Patent
Chuang et al.

(10) Patent No.: US 11,011,328 B2
(45) Date of Patent: May 18, 2021

(54) KEY MODULE, KEYBOARD AND ELECTRONIC DEVICE USING SAME

(71) Applicants: LITE-ON ELECTRONICS (GUANGZHOU) LIMITED, Guangzhou (CN); LITE-ON TECHNOLOGY CORPORATION, Taipei (TW)

(72) Inventors: Wei-Pin Chuang, Taipei (TW); Ming-Fu Yen, Taipei (TW); Jian-Jhih Chen, Taipei (TW)

(73) Assignees: LITE-ON ELECTRONICS (GUANGZHOU) LIMITED; LITE-ON TECHNOLOGY CORPORATION

( * ) Notice: Subject to any disclaimer, the term of this patent is extended or adjusted under 35 U.S.C. 154(b) by 0 days.

(21) Appl. No.: 16/851,562

(22) Filed: Apr. 17, 2020

(65) Prior Publication Data

US 2020/0403614 A1      Dec. 24, 2020

Related U.S. Application Data

(60) Provisional application No. 62/863,251, filed on Jun. 18, 2019, provisional application No. 62/912,074, filed on Oct. 8, 2019.

(30) Foreign Application Priority Data

Feb. 27, 2020   (CN) .......................... 202010124650.2

(51) Int. Cl.
*H01H 13/14* (2006.01)
*H01H 13/02* (2006.01)
*H01H 13/10* (2006.01)
*H03K 17/969* (2006.01)

(52) U.S. Cl.
CPC .......... *H01H 13/14* (2013.01); *H01H 13/023* (2013.01); *H01H 13/10* (2013.01); *H03K 17/969* (2013.01); *H01H 2219/06* (2013.01); *H01H 2219/062* (2013.01)

(58) Field of Classification Search
CPC .... H03K 17/969; H01H 13/14; H01H 13/023; H01H 13/10
USPC .......................................................... 341/31
See application file for complete search history.

(56) References Cited

U.S. PATENT DOCUMENTS 3,668,407  A  *  6/1972  Matzen ................ H03K 17/969
                                                    250/229
3,750,150  A  *  7/1973  Cramer ................ H03K 17/969
                                                    341/31
3,761,919  A  *  9/1973  Baumann ............. H03K 17/969
                                                    341/31

(Continued)

*Primary Examiner* — Albert K Wong
(74) *Attorney, Agent, or Firm* — Innovation Counsel LLP

(57) ABSTRACT

A key module, a keyboard and an electronic device using same are provided. The key module includes a substrate, a light receiver, a light emitter and a lifting mechanism. The light receiver is disposed on and electrically connected with the substrate. The light emitter is disposed on and electrically connected with the substrate and disposed opposite to the light receiver. The lifting mechanism is disposed on the substrate and includes an interrupting portion, wherein the interrupting portion is movable to a region between the light receiver and the light emitter.

20 Claims, 7 Drawing Sheets

(56) References Cited

U.S. PATENT DOCUMENTS

| | | | | |
|---|---|---|---|---|
| 3,787,837 | A * | 1/1974 | Allen | B41J 5/08 341/31 |
| 4,013,342 | A * | 3/1977 | Narodny | H03K 17/969 385/18 |
| 4,049,964 | A * | 9/1977 | Wuchinich | H03K 17/968 250/221 |
| 4,152,699 | A * | 5/1979 | Sachsse | B41J 5/105 178/17 D |
| 4,311,990 | A * | 1/1982 | Burke | H03K 17/969 200/314 |
| 4,379,968 | A * | 4/1983 | Ely | H03K 17/969 250/229 |
| 4,417,824 | A * | 11/1983 | Paterson | H03K 17/969 178/17 C |
| 4,479,111 | A * | 10/1984 | Madsen | H03K 17/969 200/345 |
| 4,480,182 | A * | 10/1984 | Ely | G02B 6/3522 250/227.22 |
| 4,534,668 | A * | 8/1985 | Hildel | H03K 17/969 341/31 |
| 4,617,461 | A * | 10/1986 | Subbarao | H03K 17/969 250/229 |
| 4,795,900 | A * | 1/1989 | Kokubu | E05B 49/006 235/491 |
| 4,836,636 | A * | 6/1989 | Obara | G02B 6/353 250/227.22 |
| 4,860,008 | A * | 8/1989 | Battarel | H03K 17/969 341/31 |
| 4,868,568 | A * | 9/1989 | Souloumiac | H03K 17/969 341/31 |
| 4,884,073 | A * | 11/1989 | Souloumiac | H03K 17/943 341/31 |
| 4,931,794 | A * | 6/1990 | Haag | H03K 17/969 200/5 A |
| RE33,422 | E * | 11/1990 | Garcia, Jr. | G06F 3/0202 250/229 |
| 4,980,685 | A * | 12/1990 | Souloumiac | H03K 17/969 250/221 |
| 5,036,191 | A * | 7/1991 | Senoo | H03K 17/969 250/229 |
| 5,266,949 | A * | 11/1993 | Rossi | H03K 17/968 200/314 |
| 5,291,011 | A * | 3/1994 | Mantani | G10C 3/161 250/208.3 |
| 5,294,900 | A * | 3/1994 | Mohabbatizadeh | H01H 3/503 335/20 |
| 5,479,007 | A * | 12/1995 | Gillen | H03K 17/9629 250/221 |
| 5,569,906 | A * | 10/1996 | Wong | G01D 5/341 250/205 |
| 5,677,688 | A * | 10/1997 | O'Mara | H03K 17/969 250/227.22 |
| 5,818,037 | A * | 10/1998 | Redford | G01D 5/30 250/229 |
| 6,218,967 | B1 * | 4/2001 | Maula | H03K 17/9631 250/221 |
| 6,369,800 | B1 * | 4/2002 | Nading | G06F 3/0202 200/314 |
| 6,525,677 | B1 * | 2/2003 | Printzis | H03K 17/943 178/18.09 |
| 6,741,189 | B1 * | 5/2004 | Gibbons, II | H03K 17/969 250/227.22 |
| 6,875,977 | B2 * | 4/2005 | Wolter | H03K 17/969 250/221 |
| 7,554,077 | B2 * | 6/2009 | Chiu | G01D 5/34715 250/231.13 |
| 8,184,021 | B2 * | 5/2012 | Chou | H01H 13/83 341/22 |
| 8,717,202 | B1 * | 5/2014 | Bajaj | G06F 3/016 341/31 |
| 8,822,903 | B2 * | 9/2014 | Phan Le | G01S 17/88 250/221 |
| 2004/0136637 | A1 * | 7/2004 | Verweg | H03K 17/969 385/12 |
| 2016/0306437 | A1 * | 10/2016 | Zhang | G06F 1/1662 |

* cited by examiner

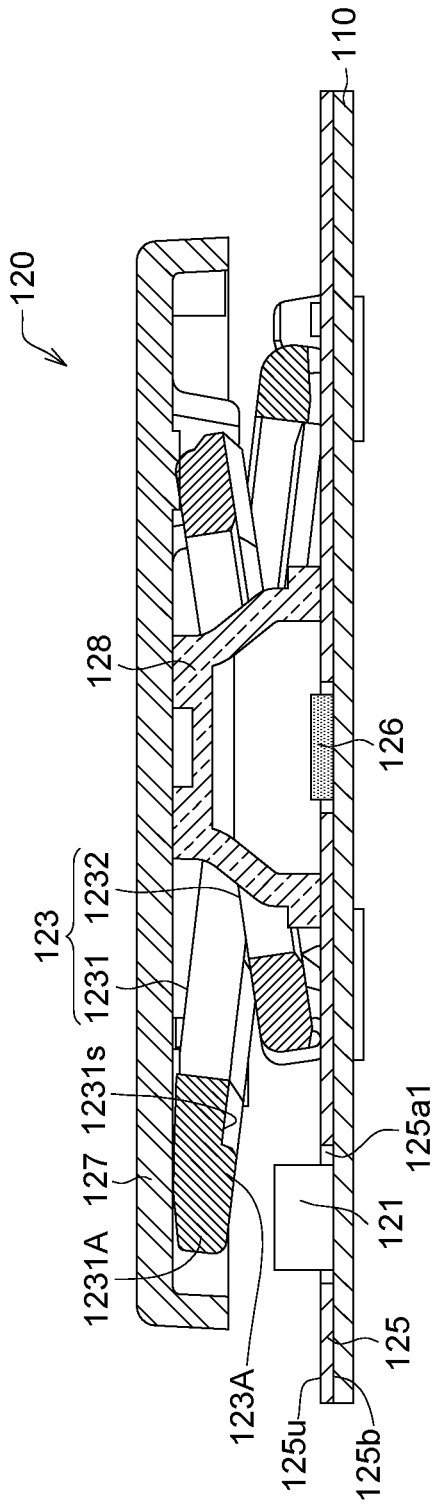
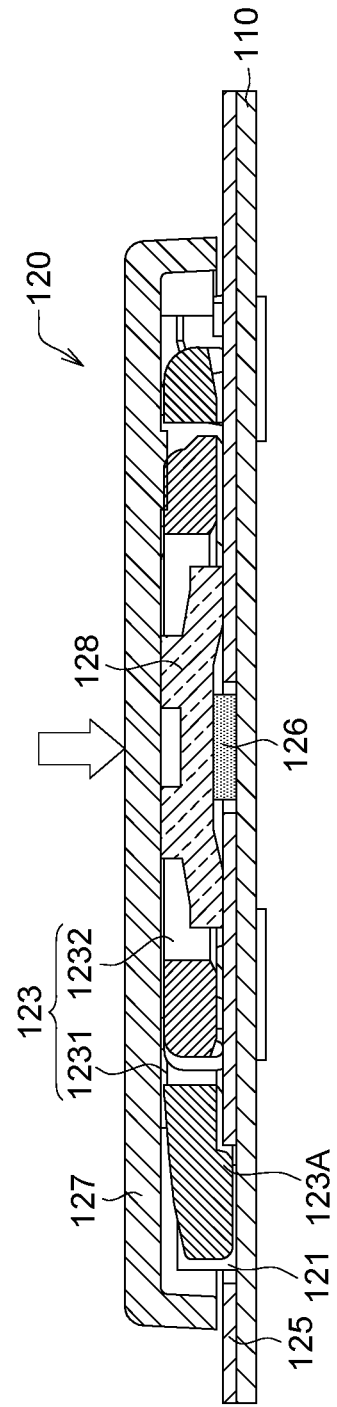
FIG. 3E
FIG. 3F

KEY MODULE, KEYBOARD AND ELECTRONIC DEVICE USING SAME

This application claims the benefit of U.S. Provisional application Ser. No. 62/863,251, filed Jun. 18, 2019, the disclosure of which is incorporated by reference herein in its entirety, claims the benefit of U.S. Provisional application Ser. No. 62/912,074, filed Oct. 8, 2019, the disclosure of which is incorporated by reference herein in its entirety, and claims the benefit of People's Republic of China application Serial No. 202010124650.2, filed on Feb. 27, 2020, the subject matter of which is incorporated herein by reference.

FIELD OF THE INVENTION

The invention relates to a key module, a keyboard and an electronic device using same, and more particularly to a key module having a lifting mechanism, a keyboard and an electronic device using same.

BACKGROUND OF THE INVENTION

In order to achieve faster trigger response, conventional keyboards usually use optical axis key. The keyboard detects whether the optical axis key is triggered by detecting interruption of the optical signal of the optical axis key. However, it is well known that the conventional optical axis key has a thick thickness, so it is difficult to incorporate the conventional optical axis key into electronic device with requirements of slim. Therefore, it is one of the efforts of those skilled in the art to propose a new key module to improve the foregoing problems.

SUMMARY OF THE INVENTION

The present invention is to provide a key module, a keyboard and an electronic device using the same capable of improving the problems of the prior art.

In one embodiment of the invention, a key module includes a substrate, a light receiver, a light emitter and a lifting mechanism. The light receiver is disposed on and electrically connected with the substrate. The light emitter is disposed on and electrically connected with the substrate and disposed opposite to the light receiver. The lifting mechanism is disposed on the substrate and includes an interrupting portion, wherein the interrupting portion is movable to a region between the light receiver and the light emitter.

In another embodiment of the invention, a keyboard includes a substrate and a plurality of key module. The key modules are disposed on the substrate and each key module includes a light receiver, a light emitter and a lifting mechanism. The light receiver is disposed on and electrically connected with the substrate. The light emitter is disposed on and electrically connected with the substrate and disposed opposite to the light receiver. The lifting mechanism is disposed on the substrate and includes an interrupting portion, wherein the interrupting portion is movable to a region between the light receiver and the light emitter.

In another embodiment of the invention, an electronic device includes a host and a keyboard. The keyboard includes a substrate and a plurality of key modules. The key modules are disposed on the substrate and each key module includes a light receiver, a light emitter and a lifting mechanism. The light receiver is disposed on and electrically connected with the substrate. The light emitter is disposed on and electrically connected with the substrate and disposed opposite to the light receiver. The lifting mechanism is disposed on the substrate and includes an interrupting portion, wherein the interrupting portion is movable to a region between the light receiver and the light emitter.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIG. 3E shows a cross-sectional view of the key module of FIG. 3A (in an un-pressed state) taken along direction 3E-3E';

FIG. 3F shows a schematic diagram of the key module of FIG. 3E in a pressed state;

DETAILED DESCRIPTION OF PREFERRED EMBODIMENTS

Figure 1:
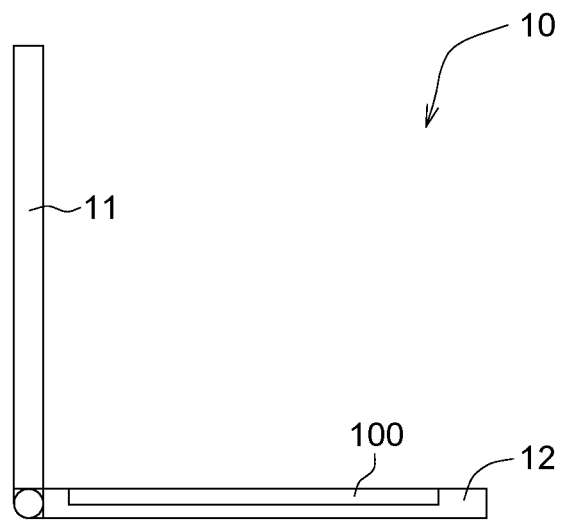
FIG. 1 shows a schematic diagram of an electronic device according to an embodiment of the present invention.
Figure 2:
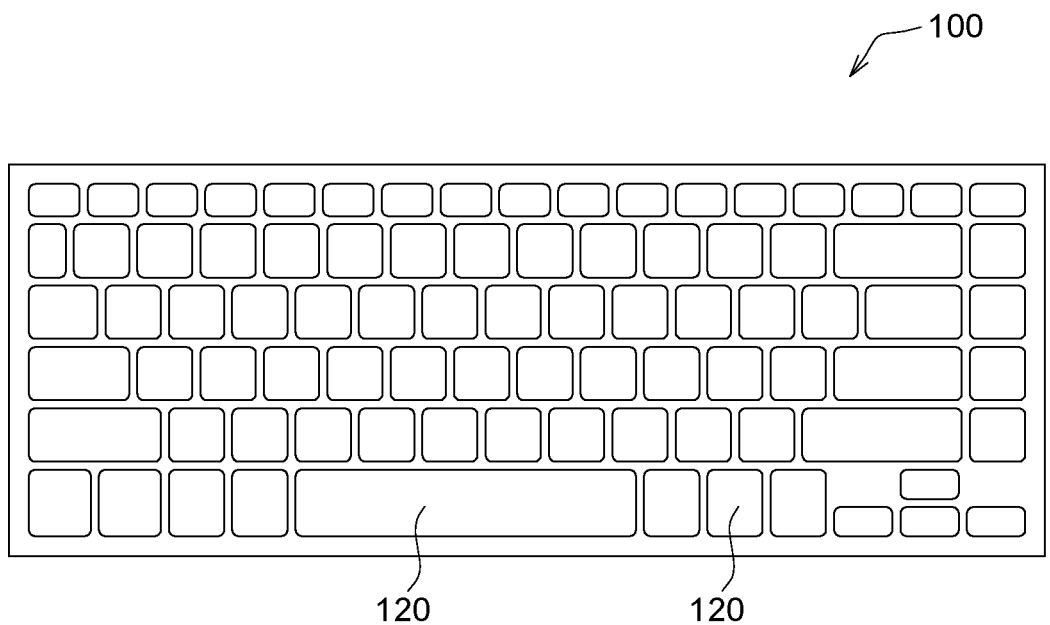
FIG. 2 shows a top view of a keyboard of FIG. 1.
Figure 3A:
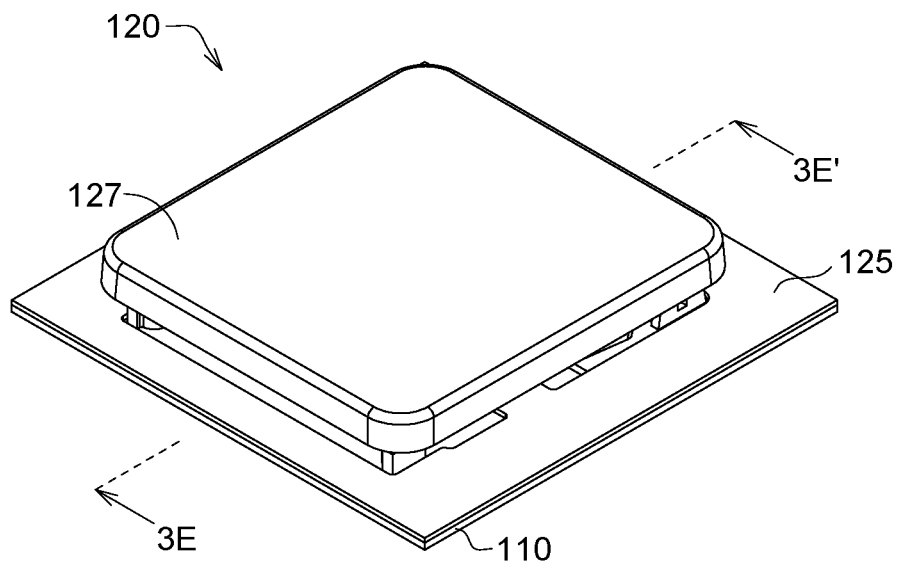
FIG. 3A shows a schematic diagram of a key module of FIG. 2.
Figure 3B:
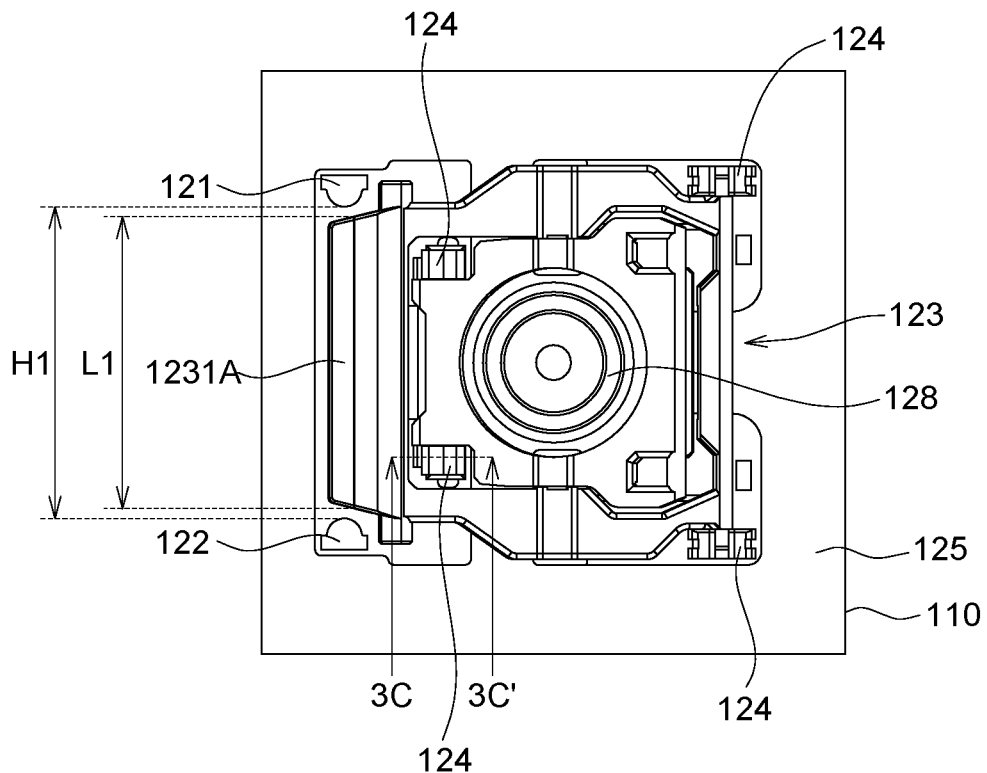
FIG. 3B shows a top view of the key module of FIG. 3A.
Figure 3C:
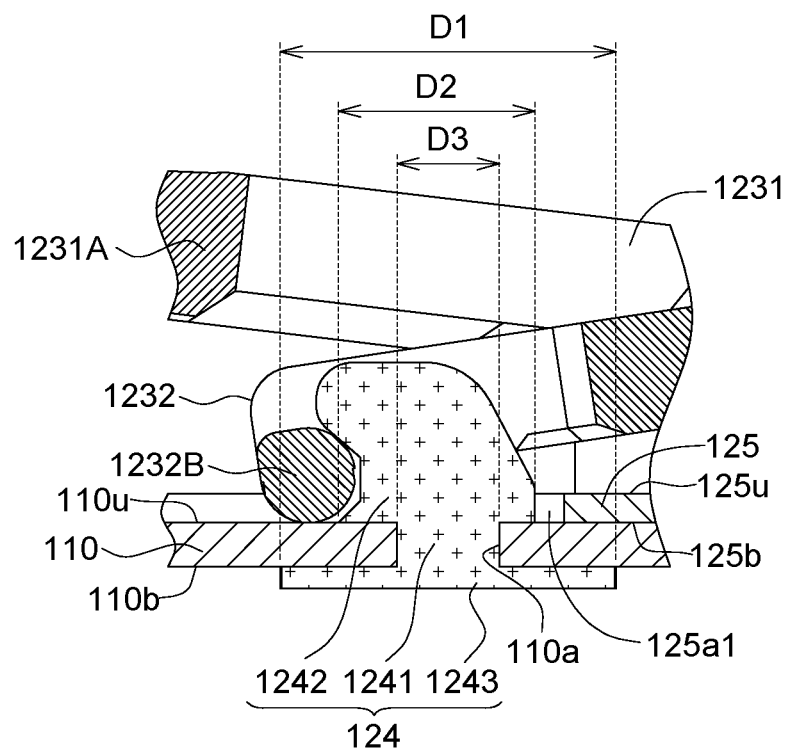
FIG. 3C shows a cross-sectional view of the key module of FIG. 3B taken along direction 3C-3C'.
Figure 3D:
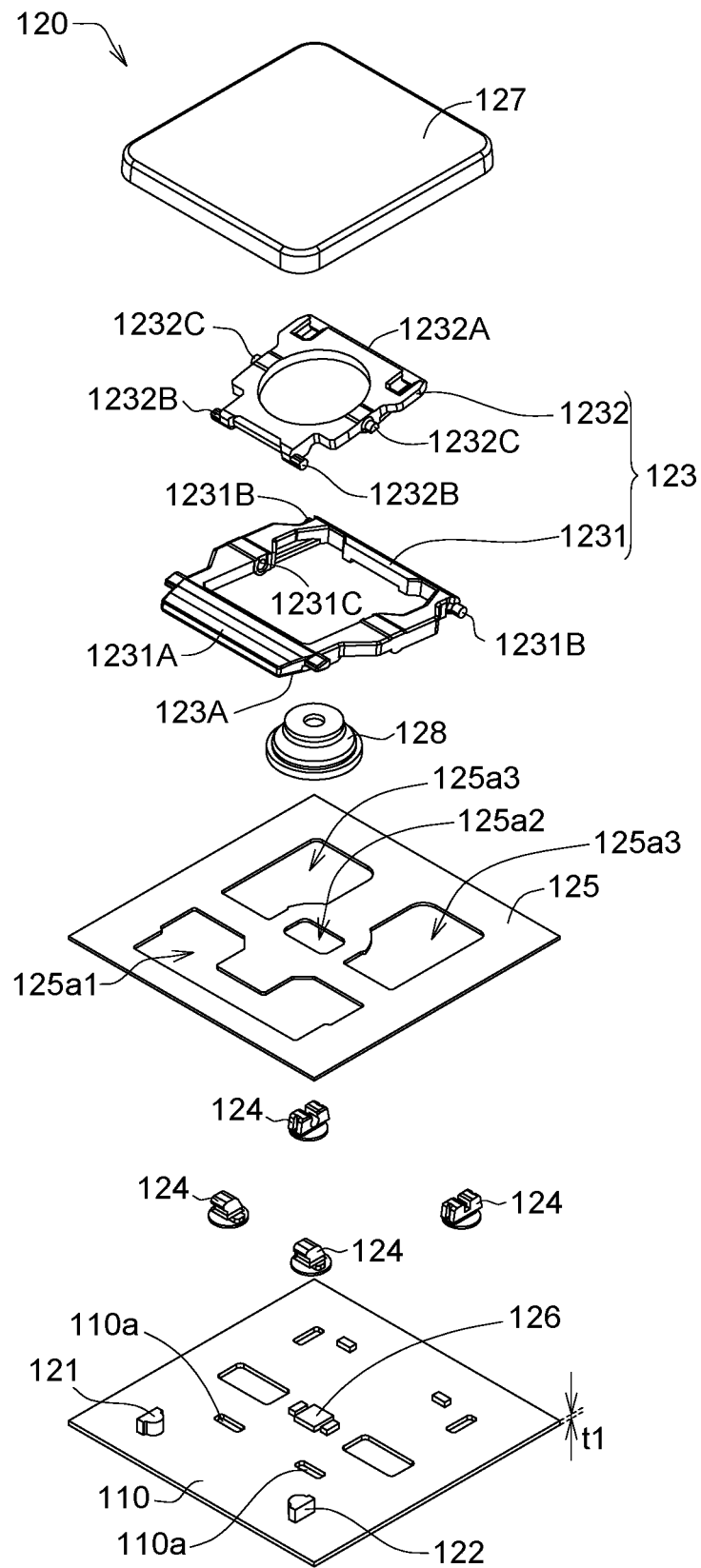
FIG. 3D shows an exploded view of the key module of FIG. 3A.

Referring to FIGS. 1 to 2 and 3A to 3F, FIG. 1 shows a schematic diagram of an electronic device 10 according to an embodiment of the present invention, FIG. 2 shows a top view of a keyboard 100 of FIG. 1, and FIG. 3A shows a schematic diagram of a key module 120 of FIG. 2, FIG. 3B shows a top view of the key module 120 (the keycap 127 is not shown) of FIG. 3A, FIG. 3C shows a cross-sectional view of the key module 120 of FIG. 3B taken along direction 3C-3C', FIG. 3D shows an exploded view of the key module 120 of FIG. 3A, FIG. 3E shows a cross-sectional view of the key module 120 of FIG. 3A (in an un-pressed state) taken along direction 3E-3E', and FIG. 3F shows a schematic diagram of the key module 120 of FIG. 3E in a pressed state.

The electronic device 10 includes a display 11, a host 12 and a keyboard 100. The keyboard 100 is electrically connected to the host 12. In the present embodiment, the electronic device 10 is, for example, a notebook computer. The host 12 is pivotally and electrically connected to the display 11. The keyboard 100 is disposed on the host 12. However, the embodiment of the present invention does not limit the type of the electronic device 10, and it could be any electronic device including a keyboard. In another embodiment, the electronic device 10 could omit the display 11. Although not shown, the host 12 includes a processor which is electrically connected the display 11 and the keyboard 100 to control operations of the display 11 and the keyboard 100.

As shown in FIGS. 2 and 3A, the keyboard 100 includes a substrate 110 and a plurality of key modules 120. At least one of the key modules 120 is disposed on the substrate 110 and is electrically connected to the substrate 110. In another embodiment, the number of the key module 120 of the keyboard 100 could be one. In other embodiments, the substrate 110 could also belong to the key module 120 (that is, the substrate 110 is sub-element of the key module 120).

The substrate 110 is, for example, a circuit board or a membrane switch layer, wherein the circuit board is a printed circuit board (PCB) or a flexible printed circuit (FPC), and the printed circuit board is, for example, a Printed Circuit Board Assembly (PCBA), and the flexible circuit board is, for example, a Flexible Printed Circuit Assembly (FPCA). The substrate 110 in the embodiment of the present invention is described by taking a printed circuit board as an example.

In one embodiment, the substrate 110 includes a base layer (not shown) and a circuit structure (not shown). The circuit structure is formed on the base layer. The base layer is made of material, for example, an insulating material, such as polyethylene terephthalate (PET), polyethylene naphthalate (PEN), polycarbonate (PC), and polypropylene (PP), Polyimide (PI), triacetine (TAC), polyvinyl chloride (PVC), polyaniline (PAn), or polycarbonate resin (Polycarbonate, PC). The base layer is, for example, a single-layer structure or a multilayer structure. The circuit structure is, for example, a wire, a pad and/or a conductive hole, etc., which could be electrically connected to the key module 120 so that the processor of the host 12 could receive the signal from the key module 120 through the circuit structure of the substrate 110.

As shown in FIG. 3D, in a key module 120, the key module 120 includes a light receiver 121, a light emitter 122, a lifting mechanism 123, at least one pivot element 124, an insulation layer 125, a light-emitting element 126, a keycap. 127 and an elastic piece 128. The light receiver 121 is disposed on and electrically connected to the substrate 110. The light emitter 122 is disposed on and electrically connected to the substrate 110, and the light emitter 122 is disposed opposite to the light receiver 121. The lifting mechanism 123 is disposed on the substrate 110 and includes an interrupting portion 123A (the cross-sectional structure of the interrupting portion 123A is shown in FIG. 3E). The interrupting portion 123A could be moved to a region between the light emitter 122 and the light receiver 121. As a result, when the key module 120 is in the pressed state (or triggered state), as shown in FIG. 3F, the interrupting portion 123A could enter area between the light emitter 122 and the light receiver 121 to block the optical signal between the light emitter 122 and the light receiver 121. When the optical signal between the light emitter 122 and the light receiver 121 is interrupted, it indicates that the key module 120 is triggered. When the key module 120 is triggered, the processor (not shown) of the host 12 could perform corresponding function. The interrupting portion 123A is a part of the lifting mechanism 123. In other words, in the present embodiment, the interrupting for the optical signal between the light emitter 122 and the light receiver 121 is performed by the lifting mechanism 123.

As shown in FIG. 3B, the light receiver 121 and the light emitter 122 are disposed on periphery of a projection area where the lifting mechanism 123 projects on the substrate 110, for example, outside the projection area. As a result, when the lifting mechanism 123 changes between an un-pressed state (or called it free state) and a pressed state, the lifting mechanism 123 does not interfere with the light receiver 121 and the light emitter 122. In addition, since the optical axis switches (the receiver 121 and the light emitter 122) of the embodiment of the present invention are combined with the lifting mechanism 123, the key module 120 could be thinned. As a result, the key module 120 could be easily applied to electronic devices with requirement of slim, such as notebook computers or other foldable electronic device, an electronic device with cover, etc.

The lifting mechanism 123 is pivotally connected to the pivot element 124. In this embodiment, the lifting mechanism 123 is, for example, scissor mechanism. However, the embodiment of the present invention is not limited thereto, and the lifting mechanism 123 could be another type of lifting mechanism. The lifting mechanism 123 includes an outer scissor 1231 and an inner scissor 1232 (shown in FIG. 3D). The outer scissor 1231 includes a first free end 1231A, at least one first pivot end 1231B, and at least one second pivot end 1231C, wherein the second pivot end 1231C is disposed between the first free end 1231A and the first pivot end. 1231B, and the inner scissor 1232 includes a second free end 1232A, at least a third pivot end 1232B, and at least a fourth pivot end 1232C, wherein the third pivot end 1232B is disposed between the second free end 1232A and the fourth pivot end 1232C. The second pivot end 1231C of the outer scissor 1231 is pivotally connected with the fourth pivot end 1232C of the inner scissor 1232, so that the outer scissor 1231 and the inner scissor 1232 could relatively rotate. The first pivot end 1231B of the outer scissor 1231 and the third pivot end 1232B of the inner scissor 1232 are pivotally connected to the corresponding pivot element 124, so that the outer scissor 1231 and the inner scissor 1232 could be rotated relative to the pivot element 124 and could move up and down.

As shown in FIG. 3E, in this embodiment, the interrupting portion 123A is disposed at the first free end 1231A of the outer scissor 1231. For example, the interrupting portion 123A is disposed on the first free end 1231A and protrudes with respect to a lower surface 1231s of the first free end 1231A to be closer to the area between the light emitter 122 and the light receiver 121, such that trigger stroke length of the key mode could 120 be shorter. As a result, the key module 120 could be designed thinner.

As shown in FIG. 3B, the first free end 1231A has a length L1, and the distance H1 between the light receiver 121 and the light emitter 122 is greater than the length L1. As a result, when the lifting mechanism 123 changes between the un-pressed state and the pressed state, the first free end 1231A of the lifting mechanism 123 does not interfere with the light receiver 121 and the light emitter 122. As a result, it could be ensured that the interrupting portion 123A located at the first free end 1231A could normally interrupt the optical signal between the light emitter 122 and the light receiver 121.

In addition, the outer scissor 1231 and the interrupting portion 123A are, for example, integrated into one piece. For example, the outer scissor 1231 and the interrupting portion 123A could be formed of the same material in the same process. However, in another embodiment, the outer scissor 1231 and the interrupting portion 123A could be individually formed and then combined with each other by using method, for example, gluing or engaging.

As shown in FIG. 3C, each pivot elements 124 partially embeds the substrate 110. For example, the substrate 110 has at least one embedded hole 110a, and each pivot element 124 is partially embedded in the corresponding embedded hole 110a. In terms of structure, the substrate 110 has an upper surface 110u and a lower surface 110b opposite to the upper surface 110u, and the embedded hole 110a is recessed with respect to the upper surface 110u. In this embodiment, the embedded hole 110a is, for example, a through hole, which extends from the upper surface 110u to the lower surface 110b. The pivot element 124 includes an embedded portion 1241, a pivotal portion 1242 and a stopping portion 1243. The embedded portion 1241 connects the pivotal portion 1242 and the stopping portion 1243. The embedded portion 1241 is embedded in the embedded hole 110a, the pivotal portion 1242 is connected to the embedded portion 1241 and protrudes with respect to the upper surface 110u, and the stopping portion 1243 is connected to the embedded portion 1241 and protrudes with respect to the lower surface 110u. An outer diameter D1 of the stopping portion 1243 and an outer diameter D2 of the pivotal portion 1242 are larger than an inner diameter D3 of the embedded hole 110a. As a result, the pivot element 124 could be prevented from being easily separated from the substrate 110.

In terms of the manufacturing process, the pivot element 124 and the substrate 110 could be combined together by using, for example, an injection molding technique. For example, the substrate 110 could be first embedded in a cavity of a mold (not shown), and then injection molding technology could be used to provide a flowing material (for example, a high-temperature molten material) in the cavity to be combined with the substrate 110, and the pivot element 124 is formed after the flowing material is solidified. In terms of materials, the pivot element 124 is made of, for example, an insulating material, such as plastic. The pivot element 124 could be made of material the same as or different from material of the substrate 110. In terms of material characteristics, the melting point of the pivot element 124 could be lower than the melting point of base (or core) of the substrate 110, so that during the injection molding process, the material of the pivot element 124 is in flowing state, while the substrate 110 is still controlled to maintain the solid state (it does not negatively affect the function of the substrate 110). The material of the pivot element could flow into the embedded hole 110a and the cavity of the substrate 110, and form the pivot element 124 after being solidified.

Since the pivot element 124 could provide the lifting mechanism 123 with a complete pivotal structure, the keyboard 100 or the key module 120 could selectively omit the conventional metal base plate. As a result, the thickness of the keyboard 100 or the thickness of the key module 120 could be designed to be thinner. In addition, the substrate 110 could provide appropriate or sufficient strength. Thus, even if the keyboard 100 or the key module 120 omits a conventional metal base plate, the entire keyboard 100 or the entire key module 120 could have sufficient strength. In an embodiment, as shown in FIG. 3D, the substrate 110 has a thickness t1 ranging between, for example, 0.1 mm and 5 mm or greater than the thickness of the insulation layer 125, which could provide sufficient strength for the keyboard 100 or the key module 120.

As shown in FIGS. 3D and 3E, the insulation layer 125 is, for example, a mylar film. The insulation layer 125 may be disposed on the substrate 110. The light receiver 121 and the light emitter 122 are exposed from the insulation layer 125. For example, the insulation layer 125 is disposed on the substrate 110 and has a first opening 125a1. The light receiver 121 and the light emitter 122 are located in the first opening 125a1, so that the light receiver 121 and the light emitter 122 are exposed from the insulation layer 125. In addition, the insulation layer 125 has an upper surface 125u and a lower surface 125b opposite to the upper surface 125u, and the first opening 125a1 extends from the upper surface 125u toward the lower surface 125b. In this embodiment, the first opening hole 125a1 is, for example, a through hole. One terminal of a moving path of the interrupting portion 123A could be located in the first opening 125a1. Since the first opening 125a1 could provide the interrupting portion 123A with an accommodation space, the interrupting portion 123A will not hit (or interfere with) the insulation layer 125, and the height position of the keycap 127 could be designed closer to the substrate 110, such that the thickness T1 of the key module 120 could be reduced. In addition, one or more of the pivot elements 124 could pass through the first opening 125a1, so that the inner scissor 1232 of the lifting mechanism 123 could be pivotally connected to the one or more pivot elements 124.

As shown in FIG. 3D, the light-emitting element 126 is disposed on and electrically connected to the substrate 110. The light-emitting element 126 could be exposed from the insulation layer 125. For example, the insulation layer 125 further has at least one second opening 125a2, and the light-emitting element 126 is located in the second opening 125a2, so that the light-emitting element 126 could be exposed from the insulation layer 125. In addition, the insulation layer 125 has a light-shielding property, and it could prevent the light emitted by the light-emitting element 126 from being reflected or leaking from a non-predetermined portion.

The insulation layer 125 further has at least one third opening 125a3, which could allow one or some of the pivot elements 124 to pass through the insulation layer 125, so that the outer scissor 1231 of the lifting mechanism 123 could be pivotally connected to the one or more pivot element 124.

The keycap 127 is disposed on the lifting mechanism 123 to move up and down with the lifting mechanism 123. The elastic element 128 is disposed on the insulation layer 125 and covers the light-emitting element 126. The elastic element 128 is transparent. The light emitted by the light-emitting element 126 could be emitted to the keycap 127 through the elastic element 128. When the keycap 127 is pressed (as shown in FIG. 3F), the elastic element 128 is deformed and stores elastic potential energy. When the keycap 127 is released, the elastic element 128 releases the elastic potential energy to drive the keycap 127 to return to a free state (as shown in FIG. 3E).

In one embodiment, the elastic element 128 could be assembled on the insulation layer 125 in advance, so that the elastic element 128 is assembled on the substrate 110 together with the insulation layer 125. In addition, all of the elastic elements 128 could be pre-assembled on the insulation layer 125. As a result, in one assembly process, the insulation layer 125 and all the elastic elements 128 could be assembled on the substrate 110 together.

Figure 4A:
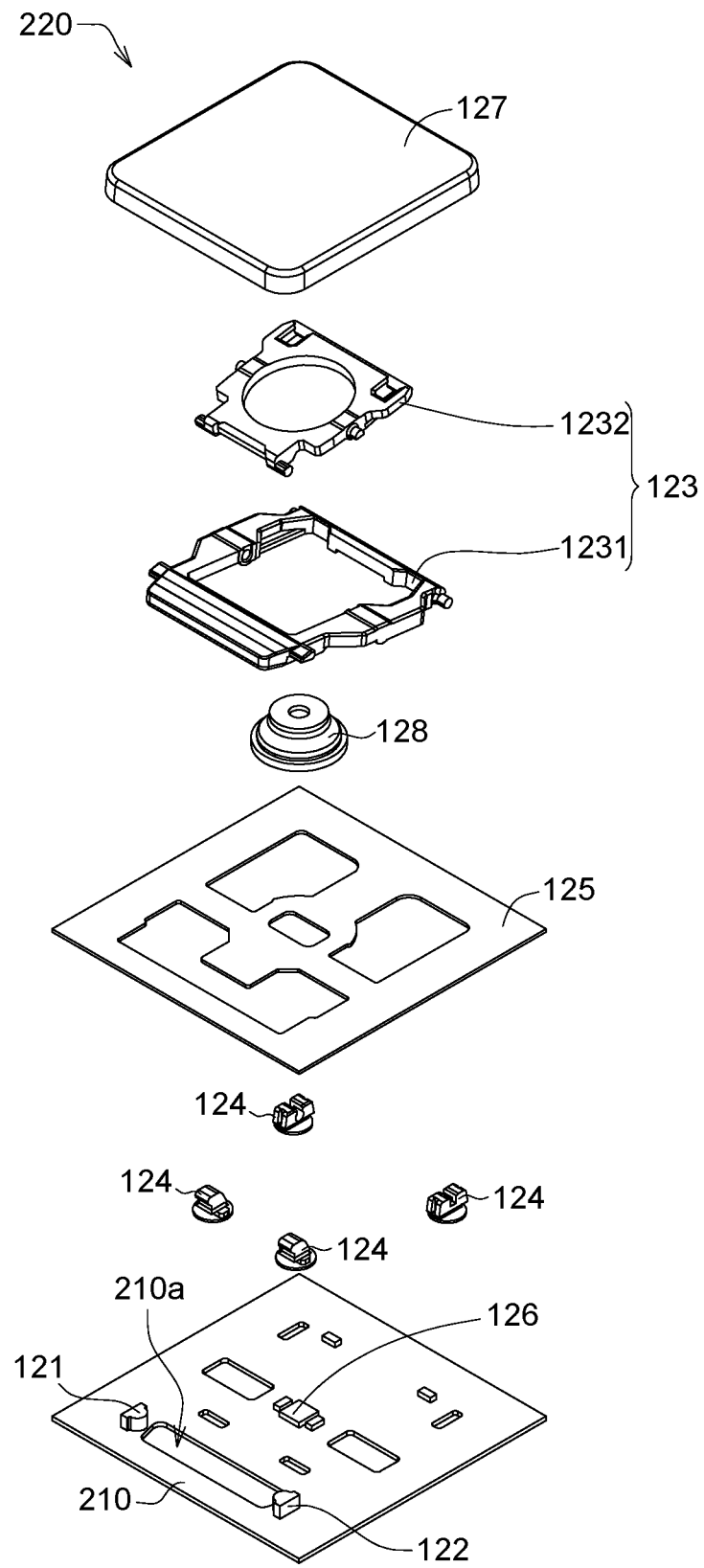
FIG. 4A shows an exploded view of a key module according to another embodiment of the present invention.
Figure 4B:
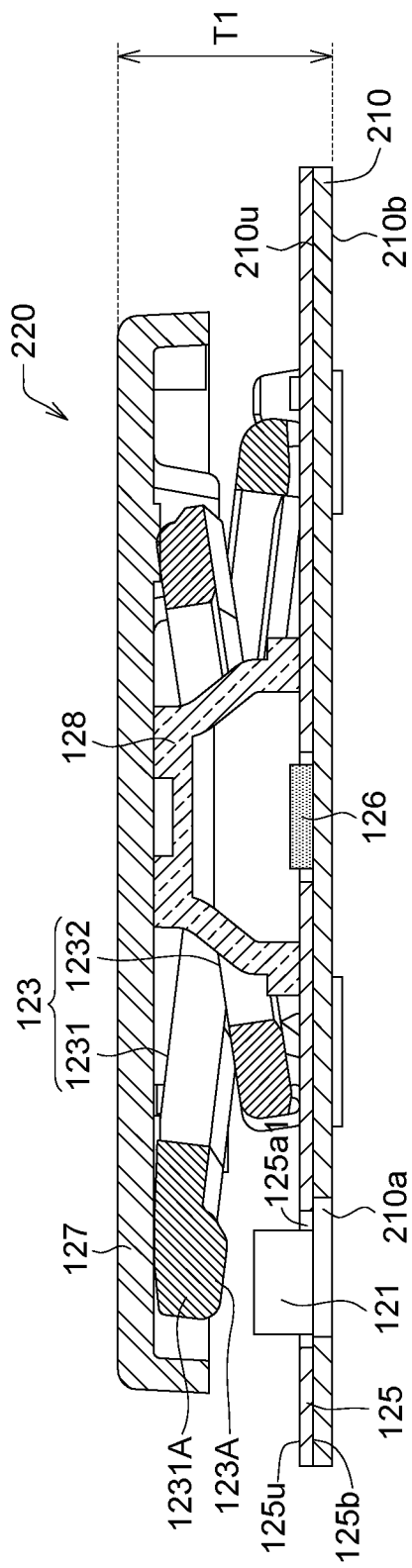
FIG. 4B shows a cross-sectional view of the key module of FIG. 4A after being combined in an un-pressed state.
Figure 4C:
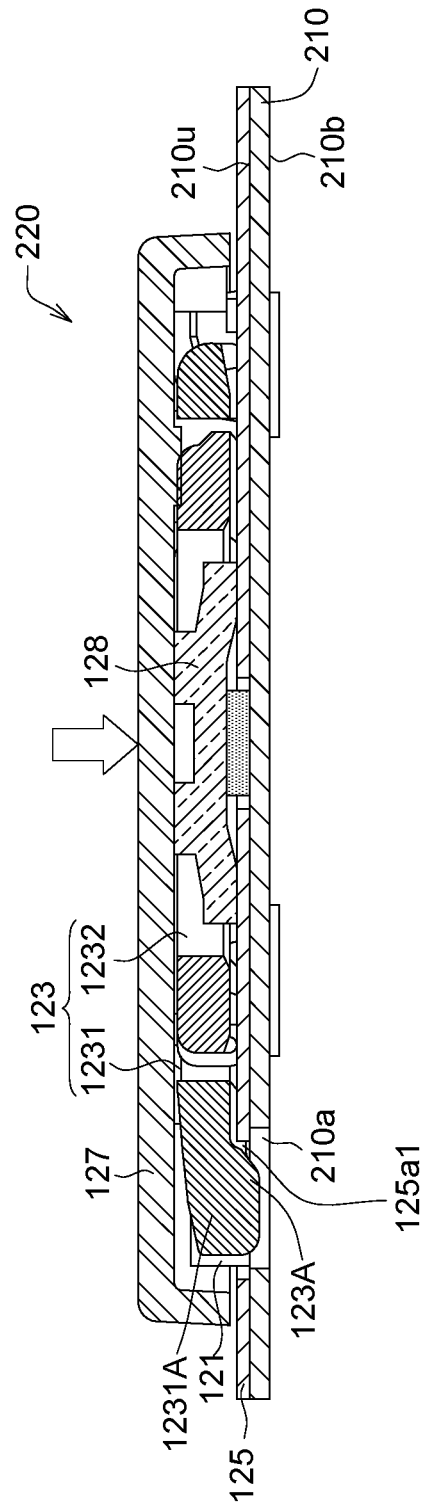
FIG. 4C shows a schematic diagram of the key module of FIG. 4B in a pressed state.

Referring to FIGS. 4A to 4C. FIG. 4A shows an exploded view of a key module 220 according to another embodiment of the present invention, FIG. 4B shows a cross-sectional view of the key module 220 of FIG. 4A after being combined in an un-pressed state, and FIG. 4C shows a schematic diagram of the key module 220 of FIG. 4B in a pressed state. The substrate 110 and the key module 120 of the keyboard 100 of the electronic device 10 could be replaced by the substrate 210 and the key module 220 of this embodiment respectively.

As shown in FIGS. 4A to 4C, the key module 220 includes the light receiver 121, the light emitter 122, the lifting mechanism 123, at least one pivot element 124, the insulation layer 125, the light-emitting element 126, the keycap 127 and the elastic element 128. The substrate 210 according to the embodiment of the present invention has structures similar to or the same as that of the substrate 110, except that the substrate 210 further has at least one recessed portion for receiving the interrupting portion 123A of the lifting mechanism 123.

As shown in FIG. 4B, the substrate 210 has a recessed portion 210a. The substrate 210 has an upper surface 210u and a lower surface 210b opposite to the upper surface 210u and includes at least one recessed portion 210a. The recessed portion 210a extends from the upper surface 210u toward the lower surface 210b. The recessed portion 210a extends from the upper surface 210u to the lower surface 210b, that is, the recessed portion 210a is a through hole. In another embodiment, the recessed portion 210a could be a blind hole. The interrupting portion 123A of the lifting mechanism 123 further passes through the recessed portion 210a along the movement path. Since the recessed portion 210a could provide the accommodation space for the interrupting portion 123A, the height position of the keycap 127 could be designed closer to the substrate 210, such that the thickness T1 of the key module 220 could be designed to be thinner (the key module 220 with a shorter trigger stroke).

In addition, the insulation layer 125 is disposed on the substrate 210. The first opening 125a1 of the insulation layer 125 is, for example, a through hole, so that the interrupting portion 123A could reach the recessed portion 210a through the first opening 125a1.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A key module, comprises:
   a substrate;
   a light receiver disposed on and electrically connected with the substrate;
   a light emitter disposed on and electrically connected with the substrate and disposed opposite to the light receiver; and
   a lifting mechanism disposed on the substrate and comprising an interrupting portion, wherein the interrupting portion is movable to a region between the light receiver and the light emitter;
   wherein the substrate has an embedded hole, and the key module further comprises:
   a pivot element partially embedded in the embedded hole;
   wherein the lifting mechanism is pivotally connected to the pivot element.

2. The key module as claimed in claim 1, wherein the light receiver and the light emitter are arranged on periphery of a projection area where the lifting mechanism projects on the substrate.

3. The key module as claimed in claim 1, wherein the substrate is a circuit board or a membrane switch layer.

4. The key module as claimed in claim 1, wherein the substrate has an upper surface and a lower surface opposite to the upper surface, the embedded hole is recessed with respect to the upper surface, and the pivot element comprises:
   an embedded portion embedded in the embedded hole;
   a pivotal portion connected to the embedded portion and protruding with respect to the upper surface; and
   a stopping portion connected to the embedded portion and disposed on the lower surface.

5. The key module as claimed in claim 4, wherein an outer diameter of the stopping portion and an outer diameter of the pivotal portion are larger than an inner diameter of the embedded hole.

6. The key module as claimed in claim 1, wherein the lifting mechanism comprises a free end, and the interrupting portion is disposed on the free end and protrudes with respect to a lower surface of the free end.

7. The key module as claimed in claim 1, wherein the lifting mechanism comprises a free end having a length; a distance between the light receiver and the light emitter is greater than the length of the free end.

8. The key module as claimed in claim 1, wherein the substrate has a recessed portion, and the interrupting portion passes through the recessed portion along a moving path of the interrupting portion.

9. The key module as claimed in claim 8, wherein the substrate has an upper surface and a lower surface opposite to the upper surface, and the recessed portion extends from the upper surface toward the lower surface.

10. The key module as claimed in claim 8, wherein the recessed portion extends from the upper surface to the lower surface.

11. The key module as claimed in claim 8, wherein the recessed portion is a blind hole.

12. The key module as claimed in claim 1, further comprises:
   an insulation layer disposed on the substrate and having a first opening, wherein the light receiver and the light emitter are disposed within the first opening.

13. The key module as claimed in claim 1, further comprises:
   an insulation layer disposed on the substrate and having a second opening; and
   a light-emitting element disposed on and electrically connected to the substrate, wherein the light-emitting element is disposed within the second opening.

14. The key module as claimed in claim 1, further comprises:
   an insulation layer is disposed on the substrate, wherein the insulation layer has an upper surface and a lower surface opposite to the upper surface and comprises a first opening, wherein the first opening extends from the upper surface toward the lower surface, and a terminal of a moving path of the interrupting portion is located in the first opening.

15. The key module as claimed in claim 14, wherein the first opening extends from the upper surface to the lower surface.

16. A key module, comprises:
   a substrate;
   a light receiver disposed on and electrically connected with the substrate;
   a light emitter disposed on and electrically connected with the substrate and disposed opposite to the light receiver; and
   a lifting mechanism disposed on the substrate and comprising an interrupting portion, wherein the interrupting portion is movable to a region between the light receiver and the light emitter;

wherein the lifting mechanism comprises a free end, and the interrupting portion is disposed on the free end and protrudes with respect to a lower surface of the free end.

17. The key module as claimed in claim 16, wherein the free end has a length; a distance between the light receiver and the light emitter is greater than the length of the free end.

18. The key module as claimed in claim 16, wherein the substrate has a recessed portion, and the interrupting portion passes through the recessed portion along a moving path of the interrupting portion.

19. The key module as claimed in claim 16, further comprises:
   an insulation layer disposed on the substrate and having a first opening, wherein the light receiver and the light emitter are disposed within the first opening.

20. The key module as claimed in claim 16, further comprises:
   an insulation layer is disposed on the substrate, wherein the insulation layer has an upper surface and a lower surface opposite to the upper surface and comprises a first opening, wherein the first opening extends from the upper surface toward the lower surface, and a terminal of a moving path of the interrupting portion is located in the first opening.

\* \* \* \* \*